United States Patent
Luo

(10) Patent No.: US 11,050,040 B2
(45) Date of Patent: Jun. 29, 2021

(54) METHOD FOR ENCAPSULATING DISPLAY SUBSTRATE AND DISPLAY DEVICE HAVING A PHOTO-ISOMERIZATION MATERIAL LAYER BETWEEN FIRST AND SECOND BARRIER WALLS

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 8 days.

(21) Appl. No.: 16/432,209

(22) Filed: Jun. 5, 2019

(65) Prior Publication Data

US 2020/0044190 A1    Feb. 6, 2020

(30) Foreign Application Priority Data

Aug. 3, 2018  (CN) .......................... 201810877335.X

(51) Int. Cl.
  *H01L 51/52* (2006.01)
  *H01L 51/56* (2006.01)
(52) U.S. Cl.
  CPC .......... *H01L 51/5253* (2013.01); *H01L 51/56* (2013.01); *H01L 2251/105* (2013.01)
(58) Field of Classification Search
  CPC ............... H01L 51/5237; H01L 51/524; H01L 51/5253; H01L 51/5256
  See application file for complete search history.

(56) References Cited

U.S. PATENT DOCUMENTS

| 9,647,236 B2 | 5/2017 | Fujino et al. | |
|---|---|---|---|
| 2016/0141550 A1 | 5/2016 | Fujino et al. | |
| 2018/0053810 A1* | 2/2018 | Jin | G06F 3/04164 |
| 2018/0138450 A1* | 5/2018 | Park | H01L 51/5256 |
| 2018/0233541 A1* | 8/2018 | Zeng | G06F 3/0412 |

FOREIGN PATENT DOCUMENTS

| CN | 104022233 A | 9/2014 |
|---|---|---|
| CN | 106848107 A | 6/2017 |
| CN | 108258149 A | 7/2018 |

OTHER PUBLICATIONS

First Office Action, including Search Report, for Chinese Patent Application No. 201810877335.X, dated Nov. 19, 2019, 12 pages.

* cited by examiner

*Primary Examiner* — Hoai V Pham
(74) *Attorney, Agent, or Firm* — Westman, Champlin & Koehler, P.A.

(57) ABSTRACT

Provided is a method for encapsulating a display substrate, including: forming a first barrier wall and a second barrier wall in a peripheral region of the display substrate; and forming inorganic thin-film encapsulation layers and organic thin-film encapsulation layers alternately laminated on the display substrate, all of the organic thin-film encapsulation layers being located in a region surrounded by the first barrier wall, the forming at least one of the inorganic thin-film encapsulation layers comprises: forming the inorganic thin-film encapsulation layer on the display substrate, a portion of the inorganic thin-film encapsulation layer being located between the first barrier wall and the second barrier wall; and disconnecting the portion of the inorganic thin-film encapsulation layer between the first barrier wall and the second barrier wall from the other portions of the inorganic thin-film encapsulation layer, and removing the portion.

18 Claims, 3 Drawing Sheets

METHOD FOR ENCAPSULATING DISPLAY SUBSTRATE AND DISPLAY DEVICE HAVING A PHOTO-ISOMERIZATION MATERIAL LAYER BETWEEN FIRST AND SECOND BARRIER WALLS

CROSS-REFERENCE TO RELATED APPLICATION

This application claims a priority to Chinese Patent Application No. 201810877335.X filed on Aug. 3, 2018, the disclosures of which are incorporated in their entirety by reference herein.

TECHNICAL FIELD

The present disclosure relates to the field of display technology, in particular, to a method for encapsulating a display substrate and a display device.

BACKGROUND

Organic Light Emitting Diode (OLED) display device has many advantages, such as self-illumination, low driving voltage, high luminous efficiency, short response time, high definition and contrast, flexible display and large-region full-color display, and is recognized as the most promising display device in the field. Due to the action of water vapor and oxygen in the air, the OLED display device will be subjected to corrosion damage, thereby lowering the display effect. Therefore, it is necessary to encapsulate the OLED device for protection. In the prior art, Thin-Film Encapsulation (TFE) is favored due to its extremely thin thickness, high barrier properties and simple manufacturing process.

SUMMARY

In a first aspect, an embodiment of the present disclosure provides a method for encapsulation a display substrate, including:
forming a first barrier wall and a second barrier wall in a peripheral region of the display substrate, the second barrier wall surrounding the first barrier wall; and
forming inorganic thin-film encapsulation layers and organic thin-film encapsulation layers alternately on the display substrate with the first barrier wall and the second barrier wall, all of the organic thin-film encapsulation layers being located in a region surrounded by the first barrier wall, in which
the forming at least one of the inorganic thin-film encapsulation layers includes:
forming the inorganic thin-film encapsulation layer on the display substrate with the first barrier wall and the second barrier wall, a portion of the inorganic thin-film encapsulation layer being located between the first barrier wall and the second barrier wall; and
disconnecting the portion of the inorganic thin-film encapsulation layer between the first barrier wall and the second barrier wall from the other portions of the inorganic thin-film encapsulation layer, and removing the portion of the inorganic thin-film encapsulation layer located between the first barrier wall and the second barrier wall.

For example, the at least one of the inorganic thin-film encapsulation layers is one of the inorganic thin-film encapsulation layers proximate to the display substrate.

Optionally, the forming at least one of the inorganic thin-film encapsulation layers includes:
forming the inorganic thin-film encapsulation layers on the display substrate with the first barrier wall and the second barrier wall, a portion of the inorganic thin-film encapsulation layer being located between the first barrier wall and the second barrier wall; and
disconnecting the portion of the inorganic thin-film encapsulation layer between the first barrier wall and the second barrier wall from the other portion of the inorganic thin-film encapsulation layer, and removing the portion of the inorganic thin-film encapsulation layer located between the first barrier wall and the second barrier wall.

Optionally, the forming each of the inorganic thin-film encapsulation layers except the outermost one of the inorganic thin-film encapsulation layers includes:
forming the inorganic thin-film encapsulation layer on the display substrate with the first barrier wall and the second barrier wall, a portion of the inorganic thin-film encapsulation layer being located between the first barrier wall and the second barrier wall; and disconnecting the portion of the inorganic thin-film encapsulation layer between the first barrier wall and the second barrier wall from the other portion of the inorganic thin-film encapsulation layer, and removing the portion of the inorganic thin-film encapsulation layer located between the first barrier wall and the second barrier wall, and
the forming the outermost one of the inorganic thin-film encapsulation layers includes: forming the inorganic thin-film encapsulation layer on the display substrate with the first barrier wall and the second barrier wall, the inorganic thin-film encapsulation layer covering a display region and a peripheral region of the display substrate.

Optionally, the method further includes before the forming the inorganic thin-film encapsulation layers and the organic thin-film encapsulation layers alternately laminated on the display substrate with the first barrier wall and the second barrier wall,
forming a photo-isomerization material layer between the first barrier wall and the second barrier wall, the photo-isomerization material layer being configured to be converted from a solid state to a liquid state under the irradiation with light having a first wavelength, and converted from the liquid state to the solid state under the irradiation with light having a second wavelength,
before the disconnecting the portion of the inorganic thin-film encapsulation layer between the first barrier wall and the second barrier wall from the other portion of the inorganic thin-film encapsulation layer,
irradiating the photo-isomerization material layer with the light having the first wavelength, and
after the removing the portion of the inorganic thin-film encapsulation layer located between the first barrier wall and the second barrier wall,
irradiating the photo-isomerization material layer with the light having the second wavelength.

Optionally, the method further includes:
before the forming the inorganic thin-film encapsulation layers and the organic thin-film encapsulation layers alternately laminated on the display substrate with the first barrier wall and the second barrier wall,
forming an elastic protective layer between the first barrier wall and the second barrier wall, in which an adhesive force between the protective layer, in which the inorganic thin-film encapsulation layer is less than a preset value.

Optionally, the disconnecting the portion of the inorganic thin-film encapsulation layer between the first barrier wall and the second barrier wall from the other portion of the inorganic thin-film encapsulation layer includes:

embossing the portion of the inorganic thin-film encapsulation layer between the first barrier wall and the second barrier wall with a platen, such that the portion of the inorganic thin-film encapsulation layer between the first barrier wall and the second barrier wall is disconnected from the other portion of the inorganic thin-film encapsulation layer.

Optionally, the removing the portion of the inorganic thin-film encapsulation layer between the first barrier wall and the second barrier wall includes:

removing the portion of the inorganic thin-film encapsulation layer located between the first barrier wall and the second barrier wall by bonding with an adhesive, in which the adhesive is arranged on a surface of the platen.

Optionally, the platen is provided with a tooth mark at a position corresponding to a gap between the first barrier wall and the second barrier wall, and the adhesive is arranged on the surface of the tooth mark of the platen.

Optionally, a cross-sectional shape of the first barrier wall in a direction perpendicular to the display substrate is same as a cross-sectional shape of the second barrier wall in a direction perpendicular to the display substrate, and they are each an inverted trapezoid.

In a second aspect, an embodiment of the present disclosure discloses a display device, including: a display substrate, a first barrier wall and a second barrier wall that are located in a peripheral region of the display substrate, and inorganic thin-film encapsulation layers and organic thin-film encapsulation layers alternately laminated on the display substrate with the first barrier wall and the second barrier wall, in which the second barrier wall surrounds the first barrier wall,
all of the organic thin-film encapsulation layers are located in a region surrounded by the first barrier wall,
in a direction perpendicular to the display substrate, an orthogonal projection of at least one of the inorganic thin-film encapsulation layers on the display substrate is located within a region composed of an orthogonal projection of the first barrier wall on the display substrate and a display region of the display substrate.

For example, the at least one of the inorganic thin-film encapsulation layers is one of the inorganic thin-film encapsulation layers proximate to the display substrate.

Optionally, in a direction perpendicular to the display substrate, orthogonal projections of all of the inorganic thin-film encapsulation layers on the display substrate are located within a region composed of an orthogonal projection region of the first barrier wall on the display substrate and a display region of the display substrate.

Optionally, in a direction perpendicular to the display substrate, orthogonal projections of all of the inorganic thin-film encapsulation layers, except the outermost one of the inorganic thin-film encapsulation layers, on the display substrate are located within a region composed of an orthogonal projection region of the first barrier wall on the display substrate and a display region of the display substrate, and the outermost one of the inorganic thin-film encapsulation layers covers the display region of the display substrate and the peripheral region.

Optionally, the display device further includes a photo-isomerization material layer between the first barrier wall and the second barrier wall, the photo-isomerization material layer being configured to be converted from a solid state to a liquid state under the irradiation with light having a first wavelength, and converted from the liquid state to the solid state under the irradiation with light having a second wavelength.

Optionally, the display device further includes an elastic protective layer between the first barrier wall and the second barrier wall, in which an adhesive force between the protective layer and the inorganic thin-film encapsulation layers is less than a preset value.

Optionally, materials of the first barrier wall and the second barrier wall include a photosensitive organic material.

Optionally, the first barrier wall and the second barrier wall have a same height, from 1 μm to 5 μm.

Optionally, a cross-sectional shape of the first barrier wall in a direction perpendicular to the display substrate is same as a cross-sectional shape of the second barrier wall in a direction perpendicular to the display substrate, and they are each an inverted trapezoid.

Optionally, the photo-isomerization material layer has a height less than the height of each of the first barrier wall and the second barrier wall.

Additional aspects and advantages of the present disclosure will be set forth in part in the description, and will become apparent from the following description, or learned by practice of the present disclosure.

BRIEF DESCRIPTION OF THE DRAWINGS

The above and/or additional aspects and advantages of the present disclosure will become apparent and readily understood from the following description to the embodiment with reference to the drawings, in which.

DETAILED DESCRIPTION

Figure 1A:
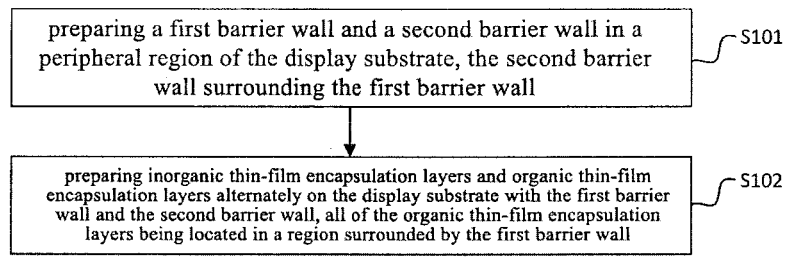
FIG. 1a and FIG. 1b are flowcharts showing a method for encapsulating a display substrate according to an embodiment of the present disclosure.

The embodiments of the present disclosure are described in detail below, and the examples of the embodiments are illustrated in the drawings, in which the same or similar reference numerals are used to refer to the same or similar elements or elements, or have the same or similar functions. The embodiments described below with reference to the drawings are intended to be illustrative only, and are not to be construed as limiting to the present disclosure.

A person skilled in the art can be understood that, the singular forms "a", "an", "said" and "the" used herein also include the plural forms, unless otherwise defined. It should be understood that the phrase "include", used in the specification of the present disclosure, is intended to mean the presence of the features, integers, steps, operations, elements and/or components, but does not exclude the presence or addition of one or more other features, integers, steps, operations, elements, components, and/or combinations thereof. It should be understood that when we mean that an element is "connected" to another element, it can be directly connected to the other element, or an intermediate element may be present. Further, "connection" used herein may include a wireless connection. The phrase "and/or" used herein includes all or any one and all combinations of one or more of the associated listed items.

A person skilled in the art will understand that all terms (including technical and scientific terms) used herein have the same meaning as commonly understood by a skilled person in the art to which the present disclosure belongs, unless otherwise defined. It should also be understood that terms defined in a general dictionary should be understood to have meaning consistent with the meaning in the context of the prior art, and will not be interpreted in an idealized or overly formal meaning unless specifically defined as herein.

At present, when OLED device is encapsuled, thin-film encapsulation methods often used include chemical vapor deposition (CVD), physical vapor deposition (PVD), atomic force deposition (ALD), etc., each of which needs to use a mask when a thin-film encapsulation layer is prepared. Due to a certain distance between the mask and the substrate of the OLED device, in the process of forming the thin-film encapsulation layer, molecules of the thin-film may go into the gap between the mask and the substrate, and a thinner film edge is formed, such a thinner film is much thinner than the desired film, and most of which is less than 90% of the desired thickness. The region of this portion can extend more than 200 μm to form a shadow effect. Especially for ALD with better encapsulation effect, the shadow effect can even reach the millimeter range.

However, in the existing thin-film encapsulation method, the thin-film encapsulation is usually prepared by laminating several thin-film encapsulation layers, in which the latter thin-film encapsulation layer must cover the shadow portion of the former thin-film encapsulation layer in the process flow, and this shadow effect will be superimposed to widen the bezel of the display device.

In summary, a new process for thin-film encapsulating the device is needed to overcome the problem of wide device frame in the prior art.

Figure 1B:
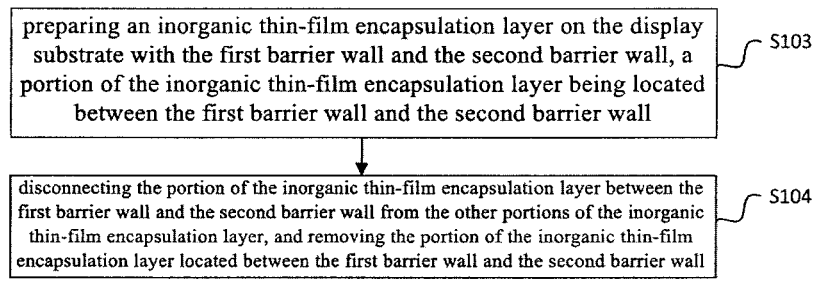

FIG. 1a and FIG. 1b are flowcharts showing a method for encapsulating a display substrate according to an embodiment of the present disclosure. In the first aspect, as shown in FIG. 1a, the display substrate includes a display region and a peripheral region, and the encapsulation method includes:

S101: forming a first barrier wall and a second barrier wall in a peripheral region of the display substrate, the second barrier wall surrounding the first barrier wall;

S102: forming inorganic thin-film encapsulation layers and organic thin-film encapsulation layers alternately on the display substrate with the first barrier wall and the second barrier wall, and all of the organic thin-film encapsulation layers being located in a region surrounded by the first barrier wall.

As shown in FIG. 1b, when the inorganic thin-film encapsulation layers are formed using the encapsulation method, a method for forming the inorganic thin-film encapsulation layer proximate to the display substrate includes:

S103: forming the inorganic thin-film encapsulation layer on the display substrate with the first barrier wall and the second barrier wall, a portion of the inorganic thin-film encapsulation layer being located between the first barrier wall and the second barrier wall;

S104: disconnecting the portion of the inorganic thin-film encapsulation layer between the first barrier wall and the second barrier wall from the other portion of the inorganic thin-film encapsulation layers, and removing the inorganic thin-film encapsulation layer located between the first barrier wall and the second barrier wall.

According to the method for encapsulating the display substrate provided by the embodiment of the present disclosure, before the inorganic thin-film encapsulation layers and the organic thin-film encapsulation layers are formed, the first barrier wall and the second barrier wall are formed in the peripheral region of the display substrate, the second barrier wall surrounds the first barrier wall, and the inorganic thin-film encapsulation layer most proximate to the display substrate during the preparation has a portion of the inorganic thin-film encapsulation layer located between the first barrier wall and the second barrier wall, and then the portion of the inorganic thin-film encapsulation layer between the first barrier wall and the second barrier wall is disconnected from the other portion of the inorganic thin-film encapsulation layer, and the portion of the inorganic thin-film encapsulation layer located between the first barrier wall and the second barrier wall is removed. Since the inorganic thin-film encapsulation layer most proximate to the display substrate during the preparation needs to remove the inorganic thin-film encapsulation layer between the first barrier wall and the second barrier wall, so that no excess inorganic thin-film encapsulation layers and organic thin-film encapsulation layers are formed on the edge of the display substrate. The method avoids the formation of the shadow effect and realizes the technical effect of the narrow bezel without affecting the overall encapsulation effect of the display substrate.

Further, in an optional embodiment, a method for forming each of the inorganic thin-film encapsulation layers is same to each other, and includes:

forming the inorganic thin-film encapsulation layers on the display substrate with the first barrier wall and the second barrier wall, a portion of each of the inorganic thin-film encapsulation layers being located between the first barrier wall and the second barrier wall;

disconnecting the portion of the inorganic thin-film encapsulation layers between the first barrier wall and the second barrier wall from the other portion of the inorganic thin-film encapsulation layers, and removing the portion of the inorganic thin-film encapsulation layers located between the first barrier wall and the second barrier wall.

In another optional embodiment, a method for forming each of the inorganic thin-film encapsulation layers except the outermost one of the inorganic thin-film encapsulation layers includes:

forming the inorganic thin-film encapsulation layers on the display substrate with the first barrier wall and the second barrier wall, a portion of each of the inorganic thin-film encapsulation layers being located between the first barrier wall and the second barrier wall;

disconnecting the portion of the inorganic thin-film encapsulation layers between the first barrier wall and the second barrier wall from the other portion of the inorganic thin-film encapsulation layers, and removing the portion of the inorganic thin-film encapsulation layers located between the first barrier wall and the second barrier wall.

The method for forming the outermost one of the inorganic thin-film encapsulation layers includes: forming an inorganic thin-film encapsulation layer on the display substrate with the first barrier wall and the second barrier wall, the inorganic thin-film encapsulation layer covering the display region and the periphery region of the display substrate.

In order to be able to remove the inorganic thin-film encapsulation layer between the first barrier wall and the second barrier wall, in the embodiment of the present disclosure, before forming inorganic thin-film encapsulation layers and organic thin-film encapsulation layers alternately laminated on the display substrate with the first barrier wall and the second barrier wall, the method further includes:

forming a photo-isomerization material layer between the first barrier wall and the second barrier wall, the photo-isomerization material layer being capable of being converted from a solid state to a liquid state under the irradiation with light having a first wavelength, and capable of being converted from a liquid state to a solid state under the irradiation with light having a second wavelength. In a specific implementation, the wavelength of the light having the first wavelength is 350 nm to 400 nm, and the wavelength of the light having the second wavelength is 500 nm to 550 nm.

Optionally, before disconnecting the inorganic thin-film encapsulation layers between the first barrier wall and the second barrier wall from the other portion of the inorganic thin-film encapsulation layers, the method further includes: irradiating the photo-isomerization material layer with the light having the first wavelength.

Optionally, after removing the inorganic thin-film encapsulation layers located between the first barrier wall and the second barrier wall, the method further includes: irradiating the photo-isomerization material layer with the light having the second wavelength.

Since the photo-isomerization material layer is converted from a solid state to a liquid state by illuminating the photo-isomerization material layer with light having the first wavelength, which facilitates the removing of the inorganic thin-film encapsulation layer between the first barrier wall and the second barrier wall. After the inorganic thin-film encapsulation layer is removed, the photo-isomerization material layer is irradiated with light having the second wavelength, and the photo-isomerization material layer is converted from a liquid state to a solid state without affecting the subsequent production process.

In the embodiment of the present disclosure, the photo-isomerization material layer formed between the first barrier wall and the second barrier wall can be changed in state by different light irradiation, that is, a free conversion between the liquid state and solid state can be realized, which facilitates the removing of the disconnected inorganic thin-film encapsulation layer between the first barrier wall and the second barrier wall.

In another embodiment, in order to be able to remove the inorganic thin-film encapsulation layer between the first barrier wall and the second barrier wall, before forming inorganic thin-film encapsulation layers and organic thin-film encapsulation layers alternately laminated on the display substrate with the first barrier wall and the second barrier wall, the method further includes: forming an elastic protective layer between the first barrier wall and the second barrier wall. An adhesive force between the protective layer and the inorganic thin-film encapsulation layers is less than a preset value. The setting of this preset value is determined according to the actual production situation. Since the adhesive force between the protective layer and the inorganic thin-film encapsulation layer is less than a preset value, it facilitates the removing of the inorganic thin-film encapsulation layer between the first barrier wall and the second barrier wall.

In the embodiment of the present disclosure, the inorganic thin-film encapsulation layer between the first barrier wall and the second barrier wall may be disconnected by using a platen. Specifically, the disconnecting the inorganic thin-film encapsulation layer between the first barrier wall and the second barrier wall from the other portion of the inorganic thin-film encapsulation layer includes:

embossing the inorganic thin-film encapsulation layer between the first barrier wall and the second barrier wall with a platen, such that the inorganic thin-film encapsulation layer between the first barrier wall and the second barrier wall is disconnected from the other portion of the inorganic thin-film encapsulation layer.

In an optional embodiment of present disclosure for removing the inorganic thin-film encapsulation layer between the first barrier wall and the second barrier wall, the removing of the inorganic thin-film encapsulation layer between the first barrier wall and the second barrier wall includes:

removing the inorganic thin-film encapsulation layer located between the first barrier wall and the second barrier wall by bonding with adhesive, in which the adhesive is arranged on a surface of the platen.

In order to facilitate the removing of the inorganic thin-film encapsulation layer between the first barrier wall and the second barrier wall, in the embodiment of the present disclosure, the adhesive has a thickness of 50 nm to 500 nm.

Further, the photo-isomerization material layer has a height less than the height of each of the first barrier wall and of the second barrier wall. Since the height of the photo-isomerization material layer is less than the height of each of the first barrier wall and of the second barrier wall, the overflow of the photo-isomerization material layer does not occur when the inorganic thin-film encapsulation layer is removed.

Advantageous effects obtained by applying the embodiments of the present disclosure include:

According to the method for encapsulating the display substrate provided by the embodiment of the present disclosure, before the inorganic thin-film encapsulation layer and the organic thin-film encapsulation layer are formed, the first barrier wall and the second barrier wall are formed in the peripheral region of the display substrate, the second barrier wall surrounds the first barrier wall, and the inorganic thin-film encapsulation layer most proximate to the display substrate during the preparation has a portion of the inorganic thin-film encapsulation layer located between the first barrier wall and the second barrier wall, and then the portion of the inorganic thin-film encapsulation layer between the first barrier wall and the second barrier wall is disconnected from the other portion of the inorganic thin-film encapsulation layer, and the inorganic thin-film encapsulation layer located between the first barrier wall and the second barrier wall is removed; since the inorganic thin-film encapsulation layer most proximate to the display substrate during the preparation needs to remove the inorganic thin-film encapsulation layer between the first barrier wall and the second barrier wall, so that no excess inorganic thin-film encapsulation layer and organic thin-film encapsulation layer are formed on the edge of the display substrate. The method avoids the formation of the shadow effect and realizes the technical effect of the narrow bezel without affecting the overall encapsulation effect of the display substrate.

The encapsulation method of the present disclosure is described in detail below with reference to a specific embodiment.

Figure 2:
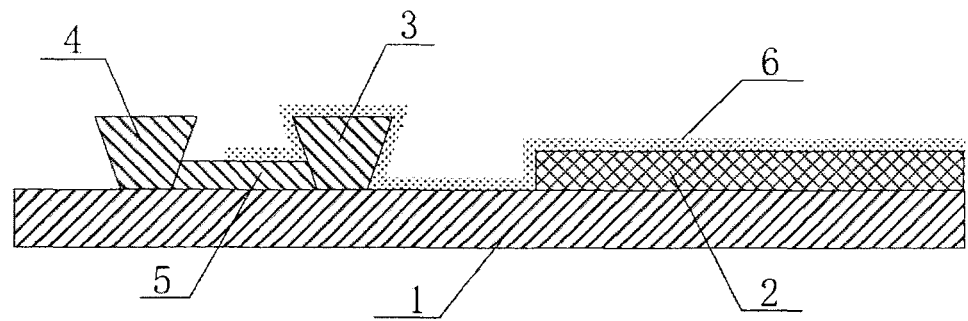
FIG. 2 is a schematic view showing a first inorganic thin-film encapsulation layer coated on a base substrate having a first barrier wall and a second barrier wall.
Figure 3:
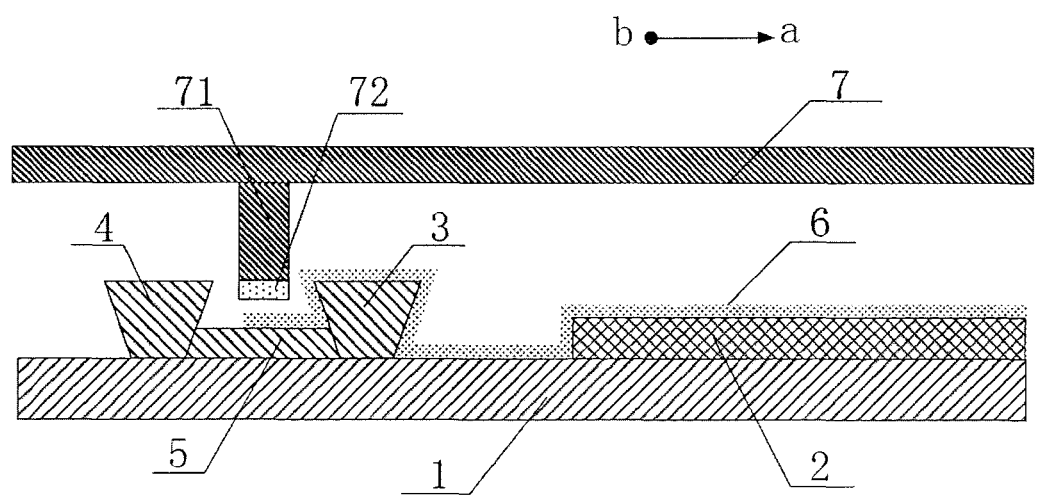
FIG. 3 is a schematic view showing a encapsulation method according to an embodiment of the present disclosure when a portion of the first inorganic thin-film encapsulation layer of FIG. 2 is removed.
Figure 4:
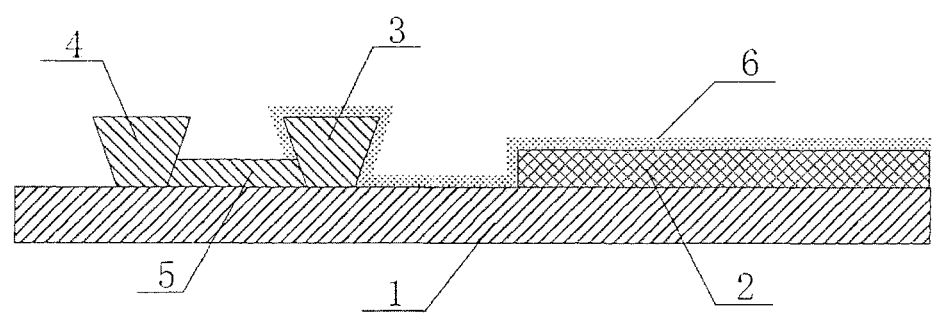
FIG. 4 is a schematic view showing a encapsulation method according to an embodiment of the present disclosure after a portion of the first inorganic thin-film encapsulation layer of FIG. 2 is removed.

FIGS. 2 to 4 respectively show schematic views of different processes of forming a display device according to the encapsulation method of the present disclosure. As shown in FIG. 2, the display device includes a display substrate 1, in which a light emitting device 2 is arranged on the display substrate 1. In the embodiment of the present disclosure, the light emitting device 2 is an OLED light emitting device, but other types of light emitting devices may also be provided by a person skilled in the art. The specific arrangement of the light emitting device 2 is similar to that in the prior art, and will not be described herein.

Next, as shown in FIG. 2, a first barrier wall 3 and a second barrier wall 4 are formed in a peripheral region of the display substrate 1, and then a photo-isomerization material layer 5 is formed between the first barrier wall 3 and the second barrier wall 4. Thereafter, a first inorganic thin-film encapsulation layer 6 is formed on the display substrate 1, in which the first inorganic thin-film encapsulation layer 6 covers the light emitting device 2, the first barrier wall 3, and a part of the photo-isomerization material layer 5 between the first barrier wall 3 and the second barrier wall 4. Therefore, a portion of the first inorganic thin-film encapsulation layer 6 will remain on the photo-isomerization material layer 5 between the first barrier wall 3 and the second barrier wall 4. It should be noted that in the existing multilayer thin-film encapsulation layer laminating process, since the latter inorganic thin-film encapsulation layer must be covered on the prepared first inorganic thin-film encapsulation layer 6 in the process flow, which will directly increase the shadow effect of the display device and widens the bezel of the display device.

Therefore, in the embodiment of the present disclosure, as shown in FIG. 3, the first inorganic thin-film encapsulation layer 6 between the first barrier 3 and the second barrier 4 is disconnected by the platen 7. Specifically, the photo-isomerization material layer 5 in the embodiment of the present disclosure is capable of being converted from a solid state to a liquid state under the irradiation with light having a first wavelength, and being converted from a liquid state to a solid state under the irradiation with light having a second wavelength. In the embodiment of the present disclosure, the wavelength of the light having the first wavelength is in the range of 350 nm to 400 nm, for example, the light having the first wavelength is ultraviolet light; the wavelength of the light having the second wavelength is 500 nm to 550 nm, for example, the light having the second wavelength is visible light.

As shown in FIG. 3, first, an ultraviolet light is irradiated between the first barrier wall 3 and the second barrier wall 4 to convert the photo-isomerization material layer 5 from a solid state to a liquid state; then, the platen 7 is pressed down. In specific implementation, the material of the platen 7 is selected from plastic, glass, quartz, metal, and the like. The platen 7 is provided with a tooth mark 71 at a position corresponding to the gap between the first barrier wall 3 and the second barrier wall 4, and the tooth mark 71 is formed of an elastic resin material. The surface of the platen 7 in the embodiment of the present disclosure has an adhesive, specifically, the surface of the tooth mark 71 included in the platen 7 has an adhesive.

Seem from the lateral direction a of the substrate 1 shown in FIG. 3, the width of the tooth mark 71 is less than the width of the gap between the first barrier wall 3 and the second barrier wall 4, so that the tooth mark 71 will not touch the first barrier wall 3 and/or the second barrier wall 4, so as to avoid damaging the overall structure of the display device.

Further, seen from the direction b which enters to FIG. 3 and is horizontally perpendicular to the lateral direction a, the length of the tooth mark 71 is at least longer than the length of the gap between the first barrier wall 3 and the second barrier wall 4, so that the excess first inorganic thin-film encapsulation layer 6 can be completely removed in the direction b. In order to subsequently remove the first inorganic thin-film encapsulation layer 6 between the first barrier 3 and the second barrier 4, the surface of the tooth 71 is provided with an adhesive 72. Specifically, the material of the adhesive 8 is rubber-based and acrylic adhesives. The thickness of the adhesive 8 is 50 nm to 500 nm.

As shown in FIG. 3, in the process of pressing down the platen 7, the tooth mark 71 is capable of disconnecting the first inorganic thin-film encapsulation layer 6 between the first barrier wall 3 and the second barrier wall 4 from the first inorganic thin-film encapsulation layer 6 at other positions (such as the first inorganic thin-film encapsulation layer 6 on the light emitting device 2 and the first barrier 3).

As shown in FIG. 3, the adhesive 72 is capable of bonding the disconnected first inorganic thin-film encapsulation layer 6. Since the photo-isomerization material layer 5 is converted from a solid state to a liquid state at this time, even if the first inorganic thin-film encapsulation layer 6 is a dense thin film, the first inorganic thin-film encapsulation layer 6 can also be completely bonded by the adhesive 72. Thereafter, the platen 7 is lifted, at which time the disconnected first inorganic thin-film encapsulation layer 6 is completely removed. In addition, a portion of the photo-isomerization material layer 5 is also bonded by the adhesive 72 in the process with a small amount of loss.

As shown in FIG. 4, finally, the visible light is irradiated, so that the photo-isomerization material layer 5 is converted from a liquid state to a solid state, and the encapsulation of the first inorganic thin-film encapsulation layer is completed.

Of course, in order to ensure the effect of the encapsulation, a plurality of the inorganic thin-film encapsulation layers and the organic thin-film encapsulation layers may be laminated alternately on the first inorganic thin-film encapsulation layer 6. The edge regions of all of the organic thin-film encapsulation layers are located within the region surrounded by the first barrier wall. The specific method for encapsulating the organic thin-film encapsulation layer is similar to that in the prior art. The encapsulation method of the remaining inorganic thin-film encapsulation layer is the same as that of the first inorganic thin-film encapsulation layer 6. Of course, the last one of inorganic thin-film encapsulation layers can also adopt the encapsulation method in prior art.

Figure 5:
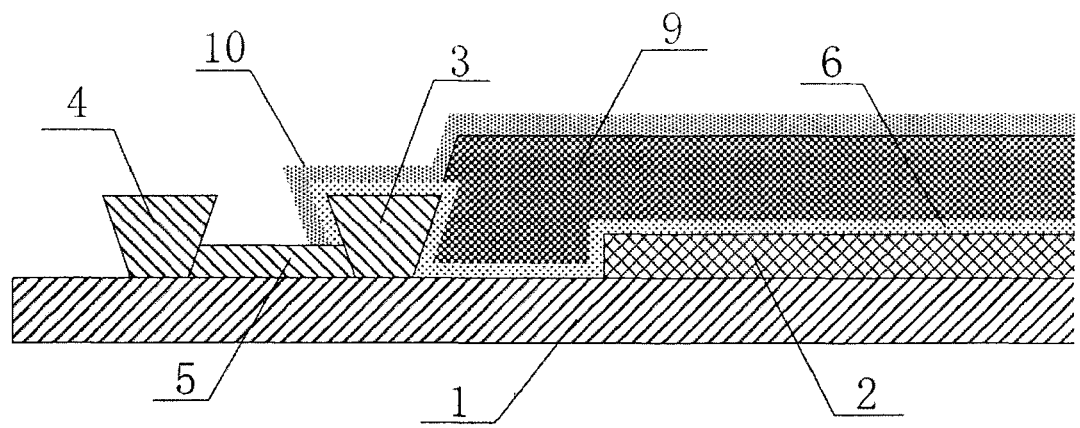
FIG. 5 is a schematic view showing a display substrate according to an embodiment of the present disclosure.

In a second aspect, the present disclosure further provides a display device, as shown in FIG. 5, the display device includes: a display substrate 1, a first barrier wall 3 and a second barrier wall 4 located in a peripheral region of the display substrate 1, and inorganic thin-film encapsulation layers (first inorganic thin-film encapsulation layer 6 and second inorganic thin-film encapsulation layer 10) and organic thin-film encapsulation layers 9 alternately laminated on the display substrate with the first barrier wall 3 and the second barrier 4 wall. The second barrier wall 4 surrounds the first barrier wall 3. In a specific embodiment, the distance between the second barrier wall 4 and the first barrier wall 3 is a preset distance, which is set according to actual production requirements, and the preset distance is 0.1 mm to 1 mm.

Of course, in the actual production process, according to the specific process requirements, more than two barrier walls, e.g., three barrier walls may be arranged in the peripheral region of the display substrate 1, as long as the barrier wall can be configured to achieve a narrow bezel. However, the number of the barrier wall should not be set too many, which leads to the bezels being wider than the bezels of the prior art in shadow effect, and fails to achieve narrow bezels.

With continued reference to FIG. 5, all of the organic thin-film encapsulation layers are located in a region surrounded by the first barrier wall. In the direction perpendicular to the display substrate 1, the orthogonal projection of the inorganic thin-film encapsulation layer most proximate to the display substrate 1 on the display substrate 1 is located within a region composed of the front projection region of the first barrier wall 3 on the display substrate 1 and the display region of the display substrate 1, that is, the first inorganic thin-film encapsulation layer 6 is located outside the region between the first barrier wall 3 and the second barrier wall 4.

Specifically, in conjunction with the encapsulation method of the present disclosure, first, a first barrier wall 3 and a second barrier wall 4 having an inverted trapezoid shape of 2 μm high are formed at the edge of the display device. The first barrier wall 3 and the second barrier wall 4 are spaced apart from each other by 1 mm. A photo-isomerization material layer 5 of 1 micron high is formed by die printing between the first barrier wall 3 and the second barrier wall 4. the photo-isomerization material layer being capable of being converted from a solid state to a liquid state under the irradiation with light having a first wavelength, and capable of being converted from a liquid state to a solid state under the irradiation with light having a second wavelength.

Next, a first inorganic thin-film encapsulation layer 6 (such as a silicon nitride layer) having a height of 1 μm is formed on the light emitting device 2 by CVD, so that the edge of the first inorganic thin-film encapsulation layer 6 covers between the first barrier wall 3 and the second barrier wall 4.

Next, an ultraviolet light is irradiated between the first barrier wall 3 and the second barrier wall 4 to convert the photo-isomerization material layer 5 from a solid state to a liquid state. The disconnected first inorganic thin-film encapsulation layer 6 between the first barrier wall 3 and the second barrier wall 4 is adhered down by the platen 7, and then the visible light is irradiated to cure the photo-isomerization material layer 5. In the embodiment of the present disclosure, the photo-isomerization material layer 5 is first formed by die printing, and then the inorganic thin-film encapsulation layer and the organic thin-film encapsulation layer are repeatedly laminated alternately to form an inorganic-organic-inorganic thin-film encapsulation structure.

In one embodiment, as shown in FIG. 5, in a direction perpendicular to the display substrate 1, orthogonal projections of all of the inorganic thin-film encapsulation layer on the display substrate 1 are located within a region composed of an orthogonal projection of the first barrier wall 3 on the display substrate 1 and a display region of the display substrate 1. The display device also includes a photo-isomerization material layer 5 between the first barrier wall and the second barrier wall.

Figure 6:
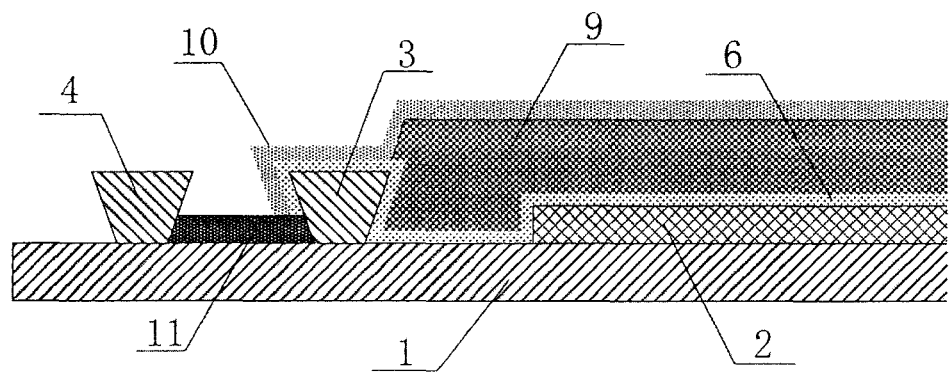
FIG. 6 is another schematic view showing a display substrate according to an embodiment of the present disclosure.

Optionally, as shown in FIG. 6, the display device further includes an elastic protective layer 11 between the first barrier wall 3 and the second barrier wall 4. An adhesive force between the protective layer 11 and the inorganic thin-film encapsulation layers is less than a preset value. At this time, the photo-isomerization material layer 5 may not be provided, and the elastic inorganic protective layer 11 having a small adhesion to the inorganic thin-film encapsulation layer may be provided, so that the protective layer 11 cannot only protect the display substrate 1 when the excess inorganic thin-film encapsulation is removed by the platen 7, but also can repeatedly use the protective layer 11, thereby reducing the manufacturing cost when the multilayer inorganic thin-film encapsulation layer is applied.

Figure 7:
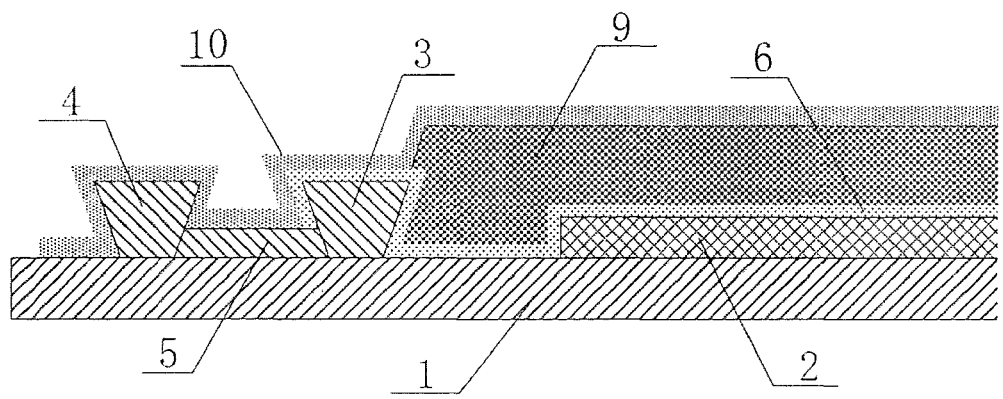
FIG. 7 is a schematic view showing a display substrate according to another embodiment of the present disclosure.

In another embodiment, as shown in FIG. 7, in which the structure of the display device is similar as that of FIG. 5, except that all inorganic thin-film encapsulation layers except the outermost inorganic thin-film encapsulation layer in a direction perpendicular to the display substrate 1, have an orthogonal projection on the display substrate 1 that is located within the region formed by the orthogonal projection region of the first barrier wall 3 on the display substrate 1 and the display region of the display substrate 1. The outermost inorganic thin-film encapsulation layer covers the display region of the display substrate and the peripheral region of the display substrate, that is, the second inorganic thin-film encapsulation layer 10 in FIG. 7 covers the entire display substrate 1, and the encapsulation effect of this arrangement is better.

The materials of the first barrier wall 3 and of the second barrier wall 4 include a photosensitive organic material, such as a photosensitive resin-based organic material, which can be formed on the display substrate 1 by photolithography. In a specific embodiment, the first barrier wall 3 and the second barrier wall 4 have the same height, and specifically, the first barrier wall 3 and the second barrier wall 4 have a height of 1 μm to 5 μm.

In a specific embodiment, a cross-sectional shape of the first barrier wall 3 in a direction perpendicular to the display substrate 1 is same as a cross-sectional shape of the second barrier wall 4 in a direction perpendicular to the display substrate 1, and optionally, the cross-sectional shape is an inverted trapezoid. The inverted trapezoid structure facilitates the disconnecting of the inorganic thin-film encapsulation layer between the first barrier wall 3 and the second barrier wall 4. In addition, the width of each of the first barrier wall 3 and of the second barrier wall 4 is between 10 μm and 20 μm.

The photo-isomerization material layer 5 between the first barrier wall 3 and the second barrier wall 4 in the embodiment of the present disclosure is capable of being converted from a solid state to a liquid state under the irradiation with light having a first wavelength, and being converted from the liquid state to the solid state under the irradiation with light having a second wavelength. The photo-isomerization material layer 5 is a photo-isomerization organic material containing azobenzene molecules, which has a property of being converted from a solid state to a liquid state under ultraviolet light irradiation, and of being converted from the liquid state to the solid state under visible light irradiation, and the thickness after film formation is less than the height of each of the first barrier wall 3 and of the second barrier wall 4.

Further, the photo-isomerization organic material of the azobenzene molecule is an organic substance having an azobenzene group in a molecular formula. The azobenzene group has both metastable cis and thermodynamically stable trans isomers. Therefore, under the irradiation of ultraviolet light, the azobenzene group changes from a cis to a trans state, and is converted from a solid state to a liquid state. Under visible light illumination of a specific wavelength, the thermodynamically metastable cis structure can be converted to the trans structure to form the final solid state. The photo-isomerization material can be formed between the barrier walls by die printing.

In a specific embodiment, the ultraviolet light has a wavelength of 350 nm to 400 nm, and the visible light has a wavelength of from 500 nm to 550 nm.

For the first inorganic thin-film encapsulation layer 6 and the second inorganic thin-film encapsulation layer 10, in the embodiment of the present disclosure, the materials of the first inorganic thin-film encapsulation layer 6 and of the second inorganic thin-film encapsulation layer 10 may be a material that blocks water and oxygen, such as silicon nitride, silicon dioxide, silicon carbide, aluminum oxide, silicon oxynitride, or nitrogen-doped silicon carbide. The first inorganic thin-film encapsulation layer 6 and the second inorganic thin-film encapsulation layer 10 may be formed into a film of 0.03 μm to 2.5 μm by chemical vapor deposition, sputtering, atomic layer deposition or the like.

For the organic thin-film encapsulation layer 9, the organic thin-film encapsulation layer 9 is an ultraviolet curable organic material, including a monomer organic body (greater than 95% by volume) and additives such as polyethylene, polystyrene, polypropylene, polyacrylic acid, polyacrylic ester, polyamide, polyimide, polycarbonate, polyurethane acrylate, polyester, polysiloxane, polysilazane, and the mixture thereof. A film of 5 μm to 10 μm can be formed by spraying, ink jet printing, printing, and the like.

Advantageous effects obtained by the embodiments of the present disclosure include:
1. The method for encapsulating a display substrate according to the present disclosure, the inorganic thin-film encapsulation layer between the first barrier wall and the second barrier wall is disconnected from the inorganic thin-film encapsulation layer at other positions, so that the edge of the inorganic thin-film encapsulation layer covers between the first barrier wall and the second barrier wall. Therefore, no unnecessary film structure is formed at the edge of the display, and the shadow effect is avoided, and the narrow bezel is realized without affecting the overall encapsulation effect of the display.
2. Since the photo-isomerization material layer formed between the first barrier wall and the second barrier wall can be changed in state by different light irradiation, that is, the free conversion between the liquid state and the solid state can be realized, and facilitates the removing of the disconnected inorganic thin-film encapsulation layer between the first barrier wall and the second barrier wall without affecting the barrier effect of the barrier layer.
3. Since the adhesive force between the protective layer and the inorganic thin-film encapsulation layer is less than a preset value, it facilitates the removing of the inorganic thin-film encapsulation layer between the first barrier wall and the second barrier wall.
4. Further, since a cross-sectional shape of the first barrier wall in a direction perpendicular to the display substrate and a cross-sectional shape of the second barrier wall in a direction perpendicular to the display substrate are an inverted trapezoid, which facilitates the disconnecting of an inorganic thin-film encapsulation layer between the first barrier wall and the second barrier wall.

The above descriptions are merely parts of embodiments in the present disclosure. It should be noted that one skilled in the art would make several improvements and substitutions without departing from the principles of the present disclosure. These improvements and modifications should also be regarded as the protection scope of the present disclosure.

What is claimed is:

1. A display device, comprising: a display substrate, a first barrier wall and a second barrier wall that are located in a peripheral region of the display substrate, and inorganic thin-film encapsulation layers and organic thin-film encapsulation layers alternately laminated on the display substrate with the first barrier wall and the second barrier wall, wherein
in a cross-sectional view perpendicular to the display substrate, the second barrier wall surrounds the first barrier wall, and
all of the organic thin-film encapsulation layers are located in a region surrounded by the first barrier wall; and
in a direction perpendicular to the display substrate, an orthogonal projection of at least one of the inorganic thin-film encapsulation layers on the display substrate is located within a region composed of an orthogonal projection of the first barrier wall on the display substrate and a display region of the display substrate; and wherein
the display device further comprises a photo-isomerization material layer between the first barrier wall and the second barrier wall, the photo-isomerization material layering being configured to be converted from a solid state to a liquid state under the irradiation with light having a first wavelength, and converted from the liquid state to the solid state under the irradiation with light having a second wavelength.

2. The display device of claim 1, wherein the at least one of the inorganic thin-film encapsulation layers is one of the inorganic thin-film encapsulation layers proximate to the display substrate.

3. The display device of claim 1, wherein in a direction perpendicular to the display substrate, orthogonal projections of all of the inorganic thin-film encapsulation layers on the display substrate are located within a region composed of an orthogonal projection region of the first barrier wall on the display substrate and a display region of the display substrate.

4. The display device of claim 1, wherein in a direction perpendicular to the display substrate, orthogonal projections of all of the inorganic thin-film encapsulation layers, except the outermost one of the inorganic thin-film encapsulation layers, on the display substrate are located within a region composed of an orthogonal projection region of the first barrier wall on the display substrate and a display region of the display substrate, and the outermost one of the inorganic thin-film encapsulation layers covers the display region of the display substrate and the peripheral region.

5. The display device of claim 1, further comprising an elastic protective layer between the first barrier wall and the second barrier wall, wherein an adhesive force between the protective layer and the inorganic thin-film encapsulation layers is less than a preset value.

6. The display device of claim 1, wherein materials of the first barrier wall and the second barrier wall comprise a photosensitive organic material.

7. The display device of claim 1, wherein the first barrier wall and the second barrier wall have a same height, from 1 μm to 5 μm.

8. The display device of claim 1, wherein a cross-sectional shape of the first barrier wall in a direction perpendicular to the display substrate is same as a cross-sectional shape of the second barrier wall in a direction perpendicular to the display substrate, and they are each an inverted trapezoid.

9. The display device of claim 1, wherein the photo-isomerization material layer has a height less than the height of each of the first barrier wall and the second barrier wall.

10. A method for encapsulating the display substrate of claim 1, comprising:
    forming a first barrier wall and a second barrier wall in a peripheral region of the display substrate, the second barrier wall surrounding the first barrier wall; and
    forming inorganic thin-film encapsulation layers and organic thin-film encapsulation layers alternately laminated on the display substrate with the first barrier wall and the second barrier wall, all of the organic thin-film encapsulation layers being located in a region surrounded by the first barrier wall, wherein the forming at least one of the inorganic thin-film encapsulation layers comprises:
    forming the inorganic thin-film encapsulation layer on the display substrate with the first barrier wall and the second barrier wall, a portion of the inorganic thin-film encapsulation layer being located between the first barrier wall and the second barrier wall; and
    disconnecting the portion of the inorganic thin-film encapsulation layer between the first barrier wall and the second barrier wall from an other portion of the inorganic thin-film encapsulation layer, and removing the portion of the inorganic thin-film encapsulation layer located between the first barrier wall and the second barrier wall; and
    the method further comprising:
    before the forming the inorganic thin-film encapsulation layers and the organic thin-film encapsulation lavers alternately laminated on the display substrate with the first barrier wall and the second barrier wall, forming a photo-isomerization material laver between the first barrier wall and the second barrier wall, the photo-isomerization material layer being capable of being converted from a solid state to a liquid state under the irradiation with light having a first wavelength, and capable of being converted from the liquid state to the solid state under the irradiation with light having a second wavelength,
    before the disconnecting the portion of the inorganic thin-film encapsulation layer between the first barrier wall and the second barrier wall from the other portion of the inorganic thin-film encapsulation layer, irradiating the photo-isomerization material layer with the light having the first wavelength, and
    after the removing the portion of the inorganic thin-film encapsulation layer located between the first barrier wall and the second barrier wall, irradiating the photo-isomerization material layer with the light having the second wavelength.

11. The method of claim 10, wherein the at least one of the inorganic thin-film encapsulation layers is one of the inorganic thin-film encapsulation layers proximate to the display substrate.

12. The method of claim 10, wherein the forming each of the inorganic thin-film encapsulation layers comprises:
    forming the inorganic thin-film encapsulation layer on the display substrate with the first barrier wall and the second barrier wall, a portion of the inorganic thin-film encapsulation layer being located between the first barrier wall and the second barrier wall; and
    disconnecting the portion of the inorganic thin-film encapsulation layer between the first barrier wall and the second barrier wall from the other portion of the inorganic thin-film encapsulation layer, and removing the portion of the inorganic thin-film encapsulation layer located between the first barrier wall and the second barrier wall.

13. The method of claim 10, wherein
    the forming each of the inorganic thin-film encapsulation layers except the outermost one of the inorganic thin-film encapsulation layers comprises:
    forming the inorganic thin-film encapsulation layer on the display substrate with the first barrier wall and the second barrier wall, a portion of the inorganic thin-film encapsulation layer being located between the first barrier wall and the second barrier wall; and disconnecting the portion of the inorganic thin-film encapsulation layer between the first barrier wall and the second barrier wall from the other portion of the inorganic thin-film encapsulation layer, and removing the portion of the inorganic thin-film encapsulation layer located between the first barrier wall and the second barrier wall, and
    the forming the outermost one of the inorganic thin-film encapsulation layers comprises:
    forming the inorganic thin-film encapsulation layer on the display substrate with the first barrier wall and the second barrier wall, the inorganic thin-film encapsulation layer covering a display region and a peripheral region of the display substrate.

14. The method of claim 10, further comprising:
    before the forming the inorganic thin-film encapsulation layers and the organic thin-film encapsulation layers alternately laminated on the display substrate with the first barrier wall and the second barrier wall, forming an elastic protective layer between the first barrier wall and the second barrier wall, wherein an adhesive force between the protective layer and the inorganic thin-film encapsulation layer is less than a preset value.

15. The method of claim 10, wherein the disconnecting the portion of the inorganic thin-film encapsulation layer between the first barrier wall and the second barrier wall from the other portion of the inorganic thin-film encapsulation layer comprises:
    embossing the portion of the inorganic thin-film encapsulation layer between the first barrier wall and the second barrier wall with a platen, such that the portion of the inorganic thin-film encapsulation layer between the first barrier wall and the second barrier wall is disconnected from the other portion of the inorganic thin-film encapsulation layer.

16. The method of claim 15, wherein the removing the portion of the inorganic thin-film encapsulation layer between the first barrier wall and the second barrier wall comprises:

removing the portion of the inorganic thin-film encapsulation layer located between the first barrier wall and the second barrier wall by bonding with an adhesive, wherein the adhesive is arranged on a surface of the platen.

17. The method of claim 15, wherein the platen is provided with a tooth mark at a position corresponding to a gap between the first barrier wall and the second barrier wall, and the adhesive is arranged on the surface of the tooth mark of the platen.

18. The method of claim 10, wherein a cross-sectional shape of the first barrier wall in a direction perpendicular to the display substrate is same as a cross-sectional shape of the second barrier wall in a direction perpendicular to the display substrate, and they are each an inverted trapezoid.

* * * * *